United States Patent [19]

Löffler

[11] Patent Number: 5,404,059
[45] Date of Patent: Apr. 4, 1995

[54] CIRCUIT FOR DRIVING A VOLTAGE-CONTROLLED SEMICONDUCTOR SWITCH

[75] Inventor: Dieter Löffler, Eberbach, Germany

[73] Assignee: ABB Patent GmbH, Mannheim, Germany

[21] Appl. No.: 34,690

[22] Filed: Mar. 19, 1993

[30] Foreign Application Priority Data

Mar. 19, 1992 [DE] Germany .................. 42 08 894.1

[51] Int. Cl.⁶ .................. H03K 17/687; H03K 3/01
[52] U.S. Cl. .................................. 327/478; 327/427
[58] Field of Search ................ 307/570, 584, 570–573, 307/125, 246

[56] References Cited

U.S. PATENT DOCUMENTS 4,970,420 11/1990 Billings ........................... 307/571

FOREIGN PATENT DOCUMENTS 8915330 6/1990 Germany .
61-100020 5/1986 Japan .
3096351 12/1991 Japan .

OTHER PUBLICATIONS

"Conference Record of the 1988 18th Power Modulator Symposium" pp. 28–33.
"Conference Record of the 1990 IEEE Industry Applications Society Annual Meeting" Part II, pp. 1049–1055.

Primary Examiner—A. D. Pellinen
Assistant Examiner—Aditya Krishnan
Attorney, Agent, or Firm—Herbert L. Lerner; Laurence A. Greenberg

[57] ABSTRACT

A dynamic and low-loss circuit for driving a voltage-controlled semiconductor switch includes a transformer having primary and secondary windings. The primary winding is connected to a voltage for driving a voltage-controlled semiconductor switch and the secondary winding has a center tap connected to the emitter or source of the semiconductor switch and secondary winding halves with outer terminals. A bridge rectifier is connected to the secondary winding and has positive and negative direct-voltage terminals. A gate resistor is connected between the gate of the voltage-controlled semiconductor switch and the positive direct-voltage terminal. A series circuit of a first resistor and an auxiliary switch is connected between the direct-voltage terminals. A capacitor is connected between the center tap and the negative direct-voltage terminal. Two diodes have cathodes connected to the outer terminals. A second resistor has one end connected to the center tap and another end connected to the anodes of the two diodes and to the gate of the auxiliary switch.

9 Claims, 3 Drawing Sheets

CIRCUIT FOR DRIVING A VOLTAGE-CONTROLLED SEMICONDUCTOR SWITCH

SPECIFICATION

The invention relates to a circuit for driving a voltage-controlled semiconductor switch having a gate connected through a gate resistor to a positive direct-voltage terminal of a bridge rectifier being connected to the secondary winding of a transformer having a primary winding across which a voltage used for driving the switch is present.

The circuit can be used in all types of semiconductor switches, in particular circuit breakers, which are controlled without power consumption means of an electrical field and in which a passive turning-off is not sufficient for reasons of dynamics, for example in MOSFETs (metal oxide semiconductor field effect transistors) and IGBTs (insulated-gate bipolar transistors). Possible applications are, for example, bypassing a starting resistor or switching a braking resistor.

However, such circuits place a relatively great load on the control voltage source and do not rapidly turn off the switch.

It is accordingly an object of the invention to provide a circuit for driving a voltage-controlled semiconductor switch, which overcomes the hereinafore-mentioned disadvantages of the heretofore-known devices of this general type, which does not put a great load on the control voltage source and which rapidly turns off the switch.

With the foregoing and other objects in view there is provided, in accordance with the invention, a circuit for driving a voltage-controlled semiconductor switch, comprising a transformer having primary and secondary windings, the primary winding being connected to a voltage for driving a voltage-controlled semiconductor switch having a gate and an emitter or source, and the secondary winding having a center tap connected to the emitter or source of the semiconductor switch and secondary winding halves with outer terminals; a bridge rectifier being connected to the secondary winding of the transformer, the bridge rectifier having positive and negative direct-voltage terminals; a gate resistor connected between the gate of the voltage-controlled semiconductor switch and the positive direct-voltage terminal of the bridge rectifier; a series circuit of a first resistor and an auxiliary switch having a gate, the series circuit being connected between the direct-voltage terminals of the bridge rectifier; a capacitor connected between the center tap of the secondary winding of the transformer and the negative direct-voltage terminal of the bridge rectifier; two diodes having anodes and cathodes, the cathodes being connected to the outer terminals of the secondary winding halves of the transformer; and a second resistor having one end connected to the center tap of the secondary winding of the transformer and having another end connected to the anodes of the two diodes and to the gate of the auxiliary switch.

The advantages which can be achieved by means of the invention include, in particular, the fact that the proposed circuit is very inexpensive and only requires little outlay. The diodes additionally needed are inexpensive signal diodes, the additional switch is an inexpensive small-signal transistor (for example a small-signal IGBT). The circuit advantageously requires neither a second transformer nor a complex drive voltage developed from positive and negative drive pulses. Furthermore, no additional supply of auxiliary energy is necessary. The power dissipation of the circuit is relatively low.

In accordance with another feature of the invention, there is provided another diode having an anode connected to the center tap and a cathode connected to the capacitor.

In accordance with a further feature of the invention, there is provided another capacitor connected parallel to the second resistor.

In accordance with a concomitant feature of the invention, there is provided a third resistor connected between the direct-voltage terminals of the bridge rectifier.

Other features which are considered as characteristic for the invention are set forth in the appended claims.

Although the invention is illustrated and described herein as embodied in a circuit for driving a voltage-controlled semiconductor switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 3:
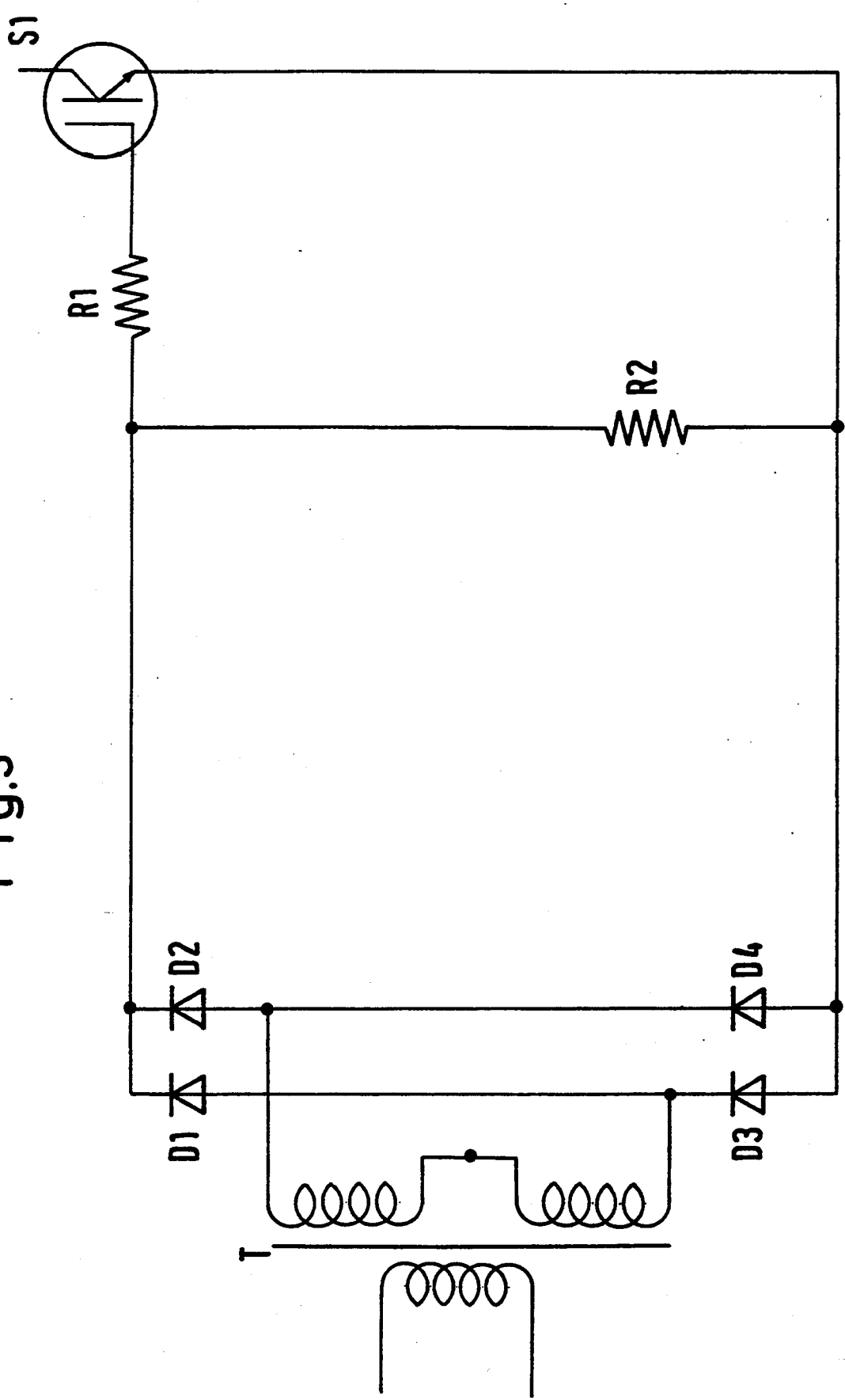
FIG. 3 is a diagram of a circuit for driving a voltage-controlled semiconductor switch.

Referring now to the figures of the drawing in detail and first, particularly, to FIG. 3 thereof, there is seen a simple circuit for driving a Voltage-controlled semiconductor switch S1. A transformer T has a primary winding to which a drive voltage for the switch S1 is applied. The switch S1 is turned on and remains in a conducting state as long as the drive voltage is present across the primary winding. By disconnecting the drive voltage across the primary winding, the switch S1 is turned off after a certain delay time and remains in the turned-off state. The transformer T has a secondary winding with terminals which are connected to alternating-voltage terminals of a bridge rectifier D1/D2/D3/D4. A positive direct-voltage terminal of the bridge rectifier leads to a gate of the switch S1 through a low-resistance bias resistor R1 (gate resistor). A negative direct-voltage terminal of the bridge rectifier is connected to an emitter or source of the switch S1 depending on whether the switch S1 is an IGBT or a MOSFET. The positive and negative direct-voltage terminals of the bridge rectifier are connected to one another through a resistor R2.

As already mentioned above, the switch S1 is turned on by a voltage that is coupled in by means of the transformer T. The input capacitance between the gate and source and between the gate and emitter of the switch S1 is charged up during the turning-on. The switch Sl is turned off passively by discharging the input capacitance through the resistors R1 and R2 after the drive voltage across the transformer T has fallen to zero potential. During the turning-off of the switch S1, two contradictory requirements must be met. On one hand, the ohmic value of the resistor R2 must not be too small so that the direct current flowing through the direct-voltage terminals of the bridge rectifier during the switching-on state of the switch S1 does not become too great. Too great a direct current puts too great a load, in particular on the control voltage source for delivering the drive voltage (relatively high power dissipation). On the other hand, a fast turning-off of the switch S1 is desired and, for this purpose, the resistor R2 should be as small as possible so that the input capacitance of the switch S1 can rapidly discharge.

Figure 1:
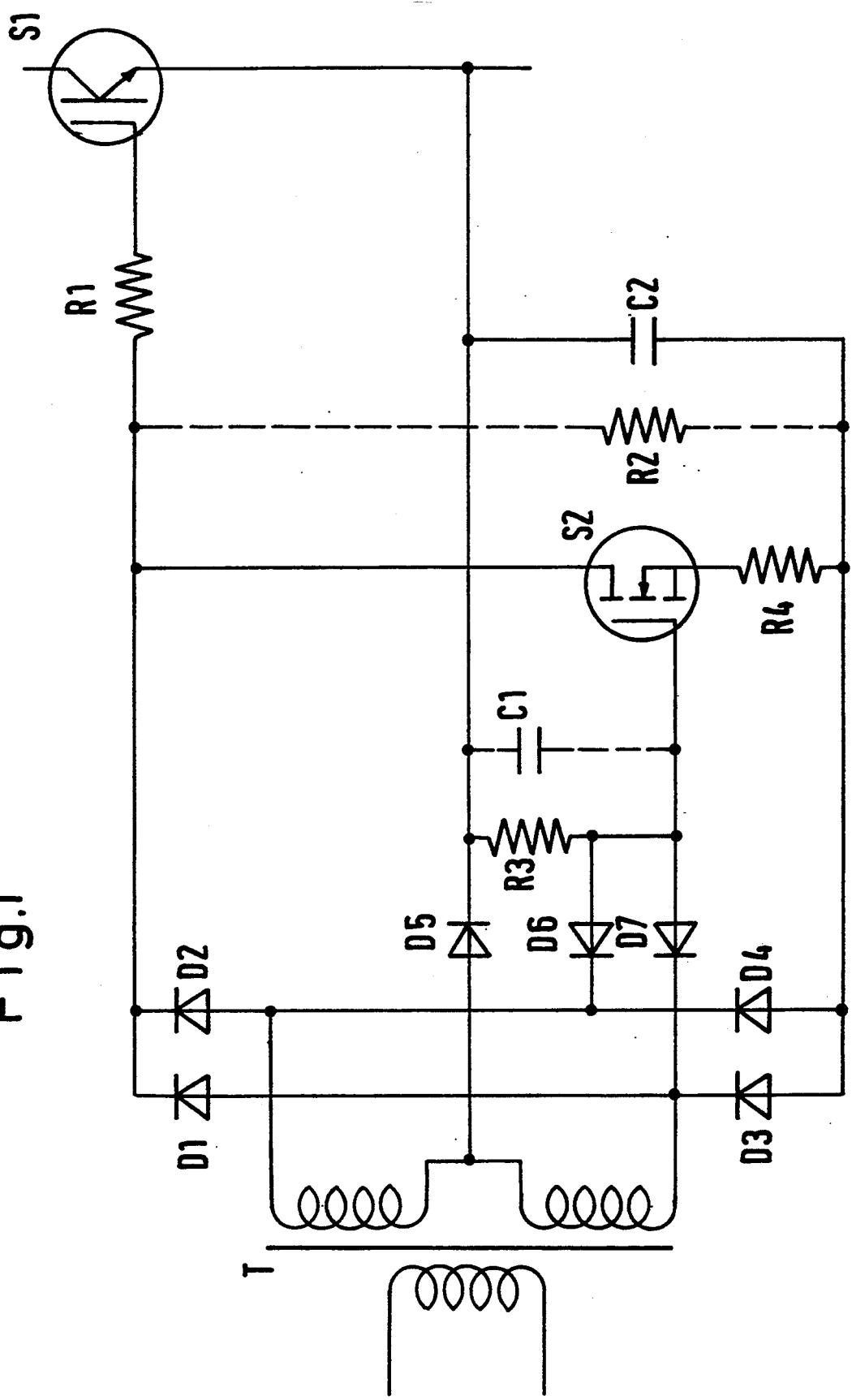
FIG. 1 is a schematic diagram of a circuit for driving an IGBT.

FIG. 1 shows a circuit for driving an IGBT. It can be seen that a transformer T includes a secondary winding having a center tap with a terminal and secondary winding halves with outer terminals. The outer terminals of the secondary winding halves are connected to a bridge rectifier D1/D2/D3/D4 and the center tap terminal is connected through a diode D5 to a first terminal of a high resistance second resistor R3, to a first terminal of a back-up capacitor C2 and to an emitter of a switch S1, that is to say of an IGBT. An anode of the diode D5 is connected to the center tap. The primary winding of the transformer T is in turn connected to a control voltage source which emits the drive voltage for turning the switch S1 on and off.

A second terminal of the resistor R3 is connected to the outer terminals of the secondary winding halves through two respective diodes D6, D7, with anodes of the diodes D6, D7 being connected to the resistor R3. A second terminal of the capacitor C2 is connected to a negative direct-voltage terminal of the bridge rectifier.

A gate of the switch S1 is in turn connected through a gate resistor R1 to a positive direct-voltage terminal of the bridge rectifier. A collector or drain of an auxiliary switch S2 is also connected to the positive direct-voltage terminal. An emitter or source of this switch S2 is connected through a low-resistance discharge first resistor R4 to the negative direct-voltage terminal of the bridge rectifier. A gate of the switch S2 is connected to a junction of the resistor R3 and the diodes D6 and D7. A MOSFET or a small-signal IGBT can be used as the auxiliary switch S2.

A back-up capacitor C1 can be connected in parallel with the second resistor R3 for voltage stabilization.

A high-resistance resistor R2 can be connected between the direct-voltage terminals of the bridge rectifier to form a reference point.

Figure 2:
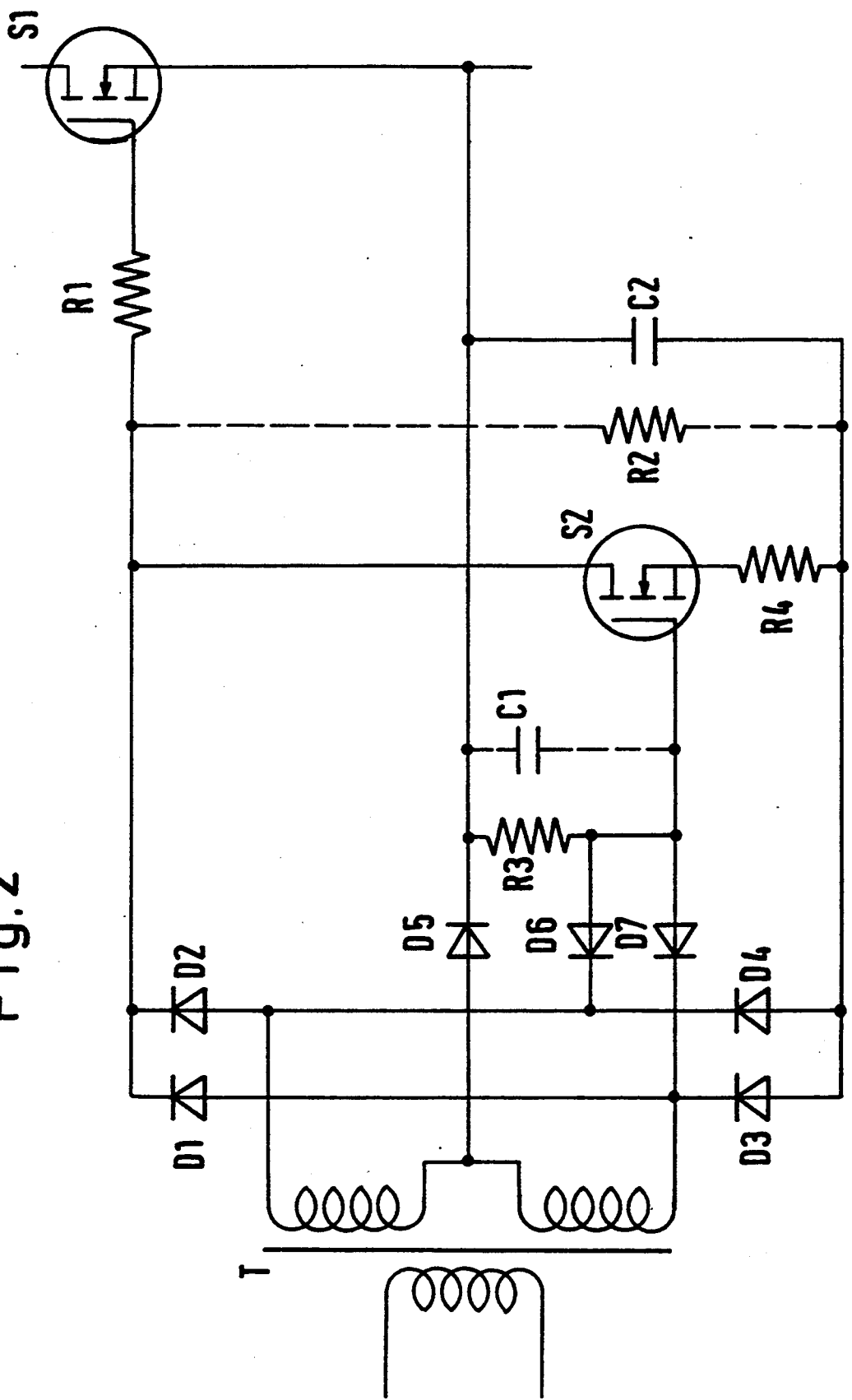
FIG. 2 is a diagram of a circuit for driving a MOSFET.

FIG. 2 shows a circuit for driving a MOSFET. This circuit corresponds to the circuit of FIG. 1, with the difference being that instead of an IGBT, a MOSFET is used as the switch S1.

In the text which follows, the operation of the circuits of FIGS. 1 and 2 will be described. In order to turn on the switch Sl, an alternating voltage is applied to the primary winding of the transformer T (drive voltage). A high-frequency burst voltage is preferably used. The alternating voltage induced in the secondary winding of the transformer is rectified through the bridge rectifier D1/D2/D3/D4 so that a positive voltage is present at cathodes of the diodes D1, D2 and a negative voltage is present at the anodes of the diodes D3, D4. The positive voltage relatively rapidly charges up the input capacitance of the switch S1 through the low-resistance resistor R1 so that the collector-emitter path or drain-source path of the switch S1 conducts.

A negative voltage is present at the anodes of the diodes D6, D7. Since this negative voltage is applied to the gate of the auxiliary switch S2, the collector-emitter path and the drain-source path of the auxiliary switch S2 remains turned off. The current flowing through the center tap of the secondary winding of the transformer T, the diode D5, the resistor R3, the diodes D6, D7 and the secondary winding halves is relatively low since the resistor R3 has a high resistance as already stated. Similarly, the current flow through the diodes D1, D2, D3, D4, the resistor R2 which can be inserted if needed and the secondary winding halves is relatively low due to the high resistance of the resistor R2. The capacitor C2 is charged up to a negative voltage with respect to the voltage of the input capacitance of the switch S1.

In order to turn off the switch S1, the alternating voltage present across the primary winding of the transformer T is disconnected. In consequence, the diodes D6, D7 are turned off and a positive voltage in comparison with the voltage at the emitter or source of the auxiliary switch S2 is applied to the gate of the auxiliary switch S2 after a short time constant through the resistor R3, due to the capacitor C1. There is no time constant if the capacitor C1 is not used. Subsequently, the collector-emitter path and the drain-source path of the auxiliary switch S2 conducts and the input capacitance between gate and source or emitter of the switch S1 is connected through the low-resistance resistor R1, the collector-emitter path and the drain-source path of the switch S2 and the low-resistance first resistor R4, to the negative potential of the capacitor C2 which leads to the rapid discharging of the input capacitance of the switch S1 and thus to the turning-off of the collector-emitter path and the drain-source path of the switch Sl (see the circuit through the emitter-gate path and the source-gate path of the switch S1, the resistor R1, the collector-emitter path and drain-source path of the auxiliary switch S2, the resistor R4 and the capacitor C2). The capacitor C2 thus ensures that a negative voltage is still available for rapidly turning off the switch S1 even after the alternating voltage across the transformer (drive voltage) has been disconnected. This considerably accelerates the turning-off process of the switch S1. The capacitor C2 is prevented from discharging due to the diode D5 being turned off.

I claim:

1. A circuit for driving a voltage-controlled semiconductor switch, comprising:

a transformer having primary and secondary windings, the primary winding being connected to a voltage for driving a voltage-controlled semiconductor switch having a gate and an emitter or source, and the secondary winding having a center tap connected to the emitter or source of the semiconductor switch and secondary winding halves with outer terminals;

a full-wave bridge rectifier connected to the outer terminals of the secondary winding of said transformer, said bridge rectifier having positive and negative direct-voltage terminals;

a gate resistor connected between the gate of the voltage-controlled semiconductor switch and the positive direct-voltage terminal of said bridge rectifier;

a first resistor and a capacitor connected to the negative direct-voltage terminal of said bridge rectifier;

an auxiliary switch having a gate, said first resistor and said auxiliary switch forming a series circuit connected between the direct-voltage terminals of said bridge rectifier;

said capacitor being connected between the center tap of the secondary winding of said transformer and the negative direct-voltage terminal of said bridge rectifier;

two diodes having anodes and cathodes, the cathodes being connected to the outer terminals of the secondary winding halves of said transformer; and a second resistor having one end connected to the center tap of the secondary winding of said transformer and to said capacitor and having another end connected to the anodes of said two diodes and to the gate of said auxiliary switch.

2. The circuit according to claim 1, including another diode having an anode connected to the center tap and a cathode connected to said capacitor.

3. The circuit according to claim 1, including another capacitor connected parallel to said second resistor.

4. The circuit according to claim 2, including another capacitor connected parallel to said second resistor.

5. The circuit according to claims 1, including a third resistor connected between the direct-voltage terminals of said bridge rectifier.

6. The circuit according to claims 2, including a third resistor connected between the direct-voltage terminals of said bridge rectifier.

7. The circuit according to claims 3, including a third resistor connected between the direct-voltage terminals of said bridge rectifier.

8. The circuit according to claims 4, including a third resistor connected between the direct-voltage terminals of said bridge rectifier.

9. A circuit for driving a voltage-controlled semiconductor switch, comprising:

a transformer having primary and secondary windings, the primary winding being connected to a voltage for driving a voltage-controlled semiconductor switch having a gate and an emitter or source, and the secondary winding having a center tap connected to the emitter or source of the semiconductor switch and secondary winding halves with outer terminals;

a full-wave bridge rectifier connected to the outer terminals of the secondary winding of said transformer, said bridge rectifier having positive and negative direct-voltage terminals;

a gate resistor connected between the gate of the voltage-controlled semiconductor switch and the positive direct-voltage terminal of said bridge rectifier;

a first resistor and a capacitor connected to the negative direct-voltage terminal of said bridge rectifier;

an auxiliary switch having a gate, said first resistor and said auxiliary switch forming a series circuit connected between the direct-voltage terminals of said bridge rectifier;

said capacitor being connected between the center tap of the secondary winding of said transformer and the negative direct-voltage terminal of said bridge rectifier;

two diodes having anodes and cathodes, the cathodes being connected to the outer terminals of the secondary winding halves of said transformer; and a second resistor connected to said capacitor; and another diode having a cathode and an anode, said anode of said further diode being connected to said center tap of said transformer and said capacitor being connected to said cathode of said other diode and to the emitter or the source of the voltage-controlled semiconductor switch.

* * * * *